United States Patent
Cheng et al.

(10) Patent No.: US 7,257,784 B2
(45) Date of Patent: Aug. 14, 2007

(54) METHOD FOR INTEGRALLY CHECKING CHIP AND PACKAGE SUBSTRATE LAYOUTS FOR ERRORS

(75) Inventors: Chia-Lin Cheng, Tao-Yuan (TW); EJ Wu, Hsinchu (TW); Shih-Cheng Chang, Hsin-Chu (TW); Kuo-Yin Chen, Hsinchu (TW)

(73) Assignee: Taiwan Semiconductor Manufacturing Co., Ltd. (CN)

( * ) Notice: Subject to any disclaimer, the term of this patent is extended or adjusted under 35 U.S.C. 154(b) by 255 days.

(21) Appl. No.: 11/089,108

(22) Filed: Mar. 24, 2005

(65) Prior Publication Data

US 2006/0217916 A1    Sep. 28, 2006

(51) Int. Cl.
*G06F 17/50* (2006.01)
(52) U.S. Cl. .............................. 716/3; 716/4; 716/716; 716/5
(58) Field of Classification Search ................ 716/3–5, 716/11, 15
See application file for complete search history.

(56) References Cited

U.S. PATENT DOCUMENTS

| | | | |
|---|---|---|---|
| 6,020,221 A * | 2/2000 | Lim et al. ..................... | 438/125 |
| 6,185,707 B1 * | 2/2001 | Smith et al. ................ | 714/724 |
| 6,581,189 B1 * | 6/2003 | Tain ............................. | 716/3 |
| 6,665,853 B2 | 12/2003 | LeCoz et al. | |
| 6,911,730 B1 * | 6/2005 | New ........................... | 257/724 |
| 2001/0052107 A1 * | 12/2001 | Anderson et al. .............. | 716/4 |
| 2004/0025126 A1 * | 2/2004 | Culler et al. ................... | 716/5 |
| 2006/0125116 A1 * | 6/2006 | Kazama et al. ............. | 257/779 |
| 2006/0272851 A1 * | 12/2006 | Haridass et al. ............ | 174/255 |

* cited by examiner

*Primary Examiner*—Paul Dinh
(74) *Attorney, Agent, or Firm*—Duane Morris LLP

(57) ABSTRACT

A method and system for integrally checking a chip layout dataset and a package substrate layout dataset for errors are disclosed. The package substrate layout dataset is converted from a first format into a second format in which the chip layout dataset is provided. The chip layout dataset of the second format is combined with the package substrate layout dataset of the second format into a combined dataset. The combined dataset is then checked for errors or design rule violations.

14 Claims, 9 Drawing Sheets

| #Layer | Datatype | Class | Subclass |
|---|---|---|---|
| 0 | 0 | Pin | L01 |
| 1 | 0 | Conductor | L01 |
| 101 | 0 | VIA_CLASS | L01 |
| 201 | 0 | VIA_CLASS | drill_01_02 |
| 2 | 0 | Conductor | L02 |
| 102 | 0 | VIA_CLASS | L02 |
| 202 | 0 | VIA_CLASS | drill_02_03 |
| 3 | 0 | Conductor | L03 |
| 103 | 0 | VIA_CLASS | L03 |
| 203 | 0 | VIA_CLASS | drill_03_04 |
| 4 | 0 | Conductor | L04 |
| 104 | 0 | VIA_CLASS | L04 |
| 204 | 0 | VIA_CLASS | drill_04_05 |
| 5 | 0 | Conductor | L05 |
| 105 | 0 | VIA_CLASS | L05 |
| 205 | 0 | VIA_CLASS | drill_05_06 |
| 6 | 0 | Conductor | L06 |
| 106 | 0 | VIA_CLASS | L06 |
| 300 | 0 | Pin | L06 |

Line 1: LAYOUT PRIMARY <top_level_cell_name_of_die>
Line 2: LAYOUT PATH <die_gds_file_path>
Line 3: LAYOUT SYSTEM GDSII Line 4: LAYOUT PRIMARY2 "STR1"
Line 5: LAYOUT PATH2 <package_gds_file_path>
Line 6: LAYOUT SYSTEM2 GDSII
Line 7: LAYOUT BUMP2 800

FIG. 4

```
Line 1:   LAYER PKG_BUMP 800
Line 2:   LAYER PKG_L01 801
Line 3:   LAYER PKG_P01 901
Line 4:   LAYER PKG_V01 1001
Line 5:   LAYER PKG_L01 802
Line 6:   LAYER PKG_P01 902
Line 7:   LAYER PKG_V01 1002
Line 8:   LAYER PKG_L01 803
Line 9:   LAYER PKG_P01 903
Line 10:  LAYER PKG_V01 1003
Line 11:  LAYER PKG_L01 804
Line 12:  LAYER PKG_P01 904
Line 13:  LAYER PKG_V01 1004
Line 14:  LAYER PKG_L01 805
Line 15:  LAYER PKG_P01 905
Line 16:  LAYER PKG_V01 1005
Line 17:  LAYER PKG_L01 806
Line 18:  LAYER PKG_P01 906
Line 19:  LAYER PKG_V01 1006
Line 20:  LAYER PKG_BALL 1100
```

METHOD FOR INTEGRALLY CHECKING CHIP AND PACKAGE SUBSTRATE LAYOUTS FOR ERRORS

BACKGROUND

The present invention relates generally to semiconductor chip designs, and more particularly to a method and system for checking errors with respect to an integration between a chip and package substrate layouts.

In conventional design methodologies, the design process and the chip manufacturing are done at different locations. Only at the final assembly process when all the individual components come together for assembly, any problems unnoticeable during the design phase may surface. Such problems include voltage supply differences, logic level incompatibilities and layout incompatibilities. If errors are not caught in the early stages, the production efficiency will be degraded.

Errors and design rule violations are often found at a chip packaging stage, due to inconsistencies between a chip layout and package substrate layout. The integration of package substrate and chip layouts has always been hard for chip designers, because in traditional chip fabrication processes, a package substrate layout has always been an untouchable territory for chip designers. Conventionally, connections between the package substrate and chip are only checked by a spreadsheet comparison, a process that could be very error-prone for most of the contents of the spreadsheet are manually keyed-in.

It is therefore desirable in the art of semiconductor chip design to provide an improved method and system for checking the integration of the chip and package substrate layouts for errors or design rule violations.

SUMMARY

The invention discloses a method and system for integrally checking a chip layout dataset and a package substrate layout dataset for errors. In one embodiment of the invention, the package substrate layout dataset is converted from a first format into a second format in which the chip layout dataset is provided. The chip layout dataset of the second format is combined with the package substrate layout dataset of the second format into a combined dataset. The combined dataset is then checked for errors or design rule violations.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3B illustrates a partial textual structure of a mapping file corresponding to the cross-sectional view in FIG. 3A in accordance with one embodiment of the present invention.

FIG. 4 illustrates a partial textual structure of a command file for instructing a modeling tool to run a check on the chip and package substrate layouts for errors or design rule violations in accordance with one embodiment of the present invention.

DESCRIPTION

Figure 1:
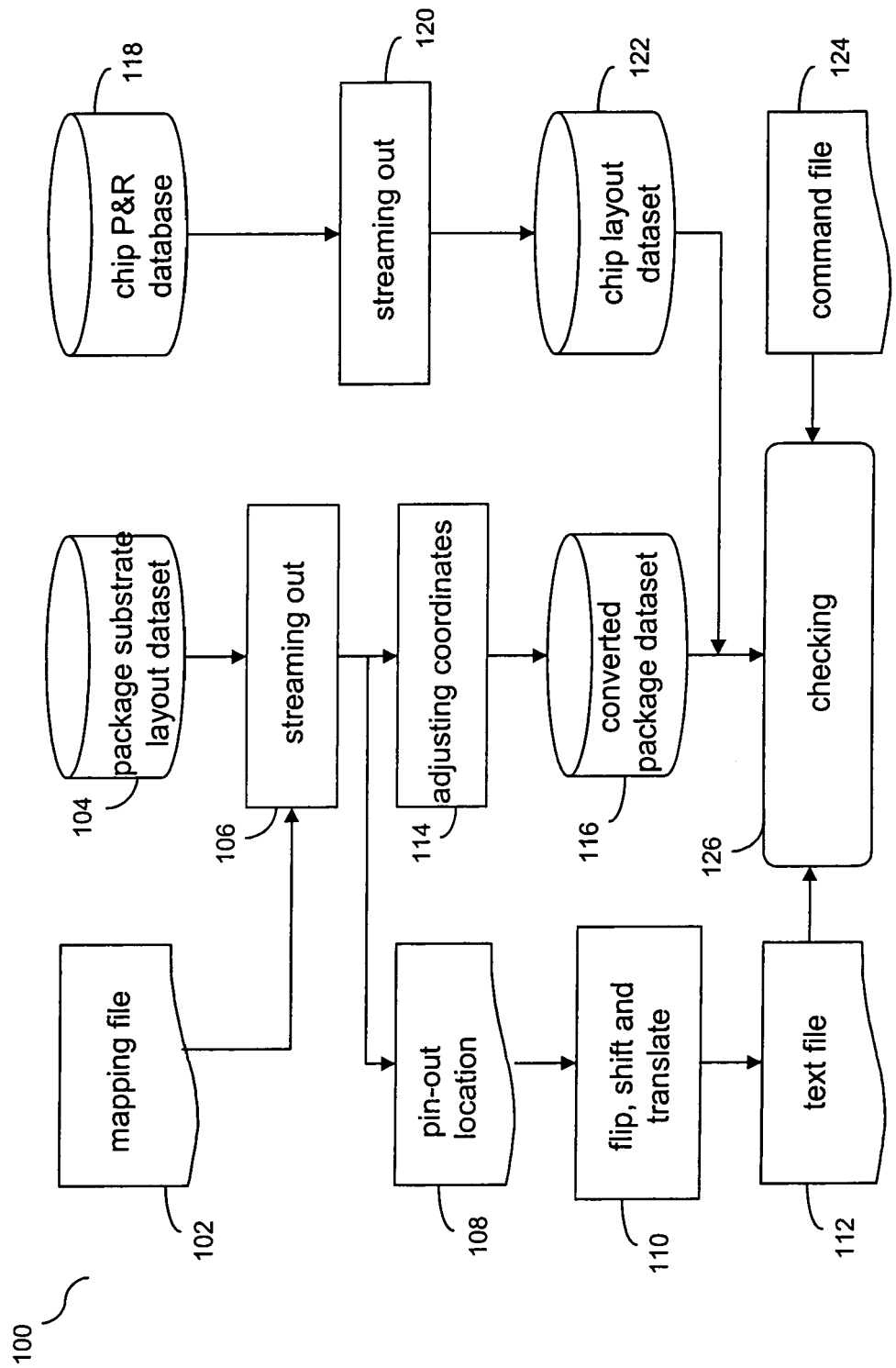
FIG. 1 illustrates a process flow for a system capable of integrally checking a chip and package substrate layouts for errors or design rule violations in accordance with one embodiment of the present invention.

FIG. 1 presents a process flow 100 for a system to integrally check chip and package substrate layouts for layout vs. schematic (LVS) errors or design-rule-checking (DRC) violations in accordance with one embodiment of the present invention. In step 102, a mapping file for mapping one or more package substrate layers is generated. The mapping file, which may be alternatively seen as a mapping dataset, includes the pin layers for the chip and the package substrate, the conductor-and-via layers for the package substrate, and the via drill hole layers (sometimes known as through-via layers) that connect the conductor-and-via layers together for the package substrate. In step 104, a package substrate layout dataset in a first format, such as a format used for multi-chip module (MCM) package layout, is generated. The package substrate layout dataset of the first format and the mapping file are inserted into a software, such as the Cadence Chip I/O Planner (CIOP) or Advanced Package Designer (APD), where they will be streamed out in step 106. This streaming process combines the mapping file into the package substrate layout dataset as a single dataset. This "combined" dataset undergoes additional adjustments in step 114 where its coordinates are flipped and shifted to match the coordinates of a chip layout dataset. Finally, in step 116, the "combined" dataset is stored in a first database and converted into a second format, the format in which the chip layout dataset is provided. For example, the second format can be a graphic design system (GDS) II format, which can be graphically viewed and edited. In other words, the combination of steps 106, 114 and 116 can be seen as a series of conversion steps for converting the package substrate layout dataset from the first format into the second format.

In step 108, the streamed out package substrate layout dataset is checked for pin-out locations, which is used to define the package alignment and dimensions to assure that the package substrate layout will fit the chip layout. In step 110, once a pin-out file has been generated, the pin-out locations data will be flipped, shifted and translated. This step is necessary for a flip-chip packaging scenario. In a flip-chip package, the coordinate system of the package substrate layout is generally different from that of the chip layout. The origin of the package substrate layout is always at the center of the layout and has to be mirrored by a predetermined virtual axis such as an Y-axis. Therefore, it needs to be adjusted to match the coordinates of the chip layout. In step 112, a text file is created to guide the software to check for errors. This text file may be seen alternatively as a comparison dataset. The steps 108, 110 and 112 may be conducted in parallel with the steps 114 and 116 as shown in FIG. 1.

Similar steps are provided to generate a chip layout dataset in the second format, such as GDSII format. In step 118, a place and route (P&R) dataset is created by using the chip's P&R database, which is essentially an unformatted netlist. It is understood that the P&R database contains all the chip layout data. The P&R dataset is further streamed out and converted into the second format, which is the same format as that for the converted package substrate layout dataset, in step 120. The chip layout dataset of the second format is stored in a second database in step 122. The combination of steps 118, 120 and 122 can be seen as a method for converting the chip layout dataset from one format to another, such as from a netlist format to a GDSII format.

In step 124, which is the final step before it is possible to check for errors, a command file is generated. This command file, which can be alternatively seen as a command dataset, instructs a modeling tool, such as Calibre, to combine the substrate layout dataset and the chip layout dataset and perform various types of error and design rule violation checks, such as LVS checks or DRC's. This checking step may be conducted using an LVS tool or a DRC tool. In step 126, the chip layout dataset of the second format is then combined with the package substrate layout dataset of the second format. Therefore, the modeling tool used in step 126 can integrally check the combined dataset for errors or design rule violations with respect to an integration of the chip layout dataset and the package substrate layout dataset. This provides a significant improvement over the prior art, which checks the chip layout and package substrate layout separately.

Figure 2:
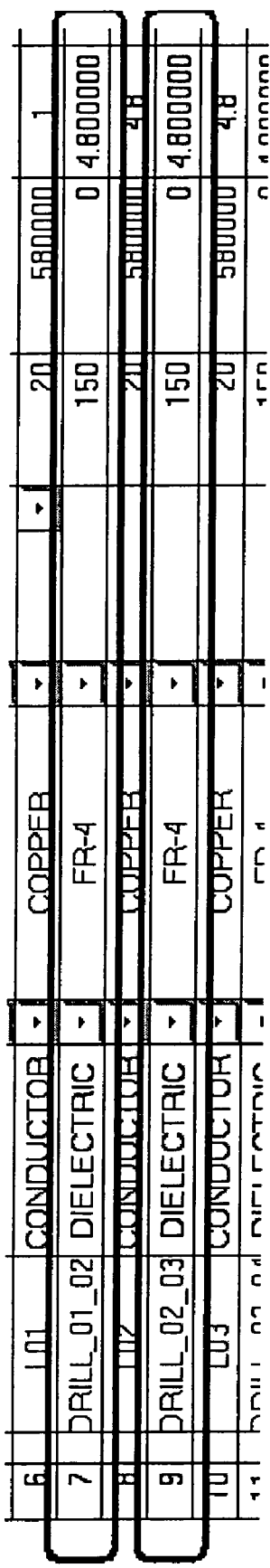
FIG. 2 illustrates a partial screen shot showing various conductor and via layers in accordance with one embodiment of the present invention.

FIG. 2 illustrates a partial screen shot 200 showing conductor and via layers in a package substrate layout data set in accordance with one embodiment of the present invention. While the conductor can be made of any other conductive materials known to one of ordinary skill in the semiconductor packaging technology, in this embodiment, the conductor material is copper. The package substrate is constructed by stacking a number of conductor-and-via layers together. For each conductor layer, there is typically a corresponding via layer. The vias not necessarily run straight through the conductors. The vias may jog so that two vias, one above a conductor and one below the conductor, connected by the conductor may not align with one another vertically.

In this embodiment, five layers are defined by software and shown as: L01, DRILL_01_02, L02, DRILL_02_03, and L03. The via layers L01, L02, and L03 are similar. The layer DRILL_01_02 is a drill layer, which connects the via layers L01 and L02 together. The drill layers DRILL_01_02 and DRILL_02_03 are also similar. Finally, the three rightmost columns describe the dimensions of the corresponding layers, which are defined in rows. These layer definitions are required for generation of a package substrate layout dataset.

Figure 3A:
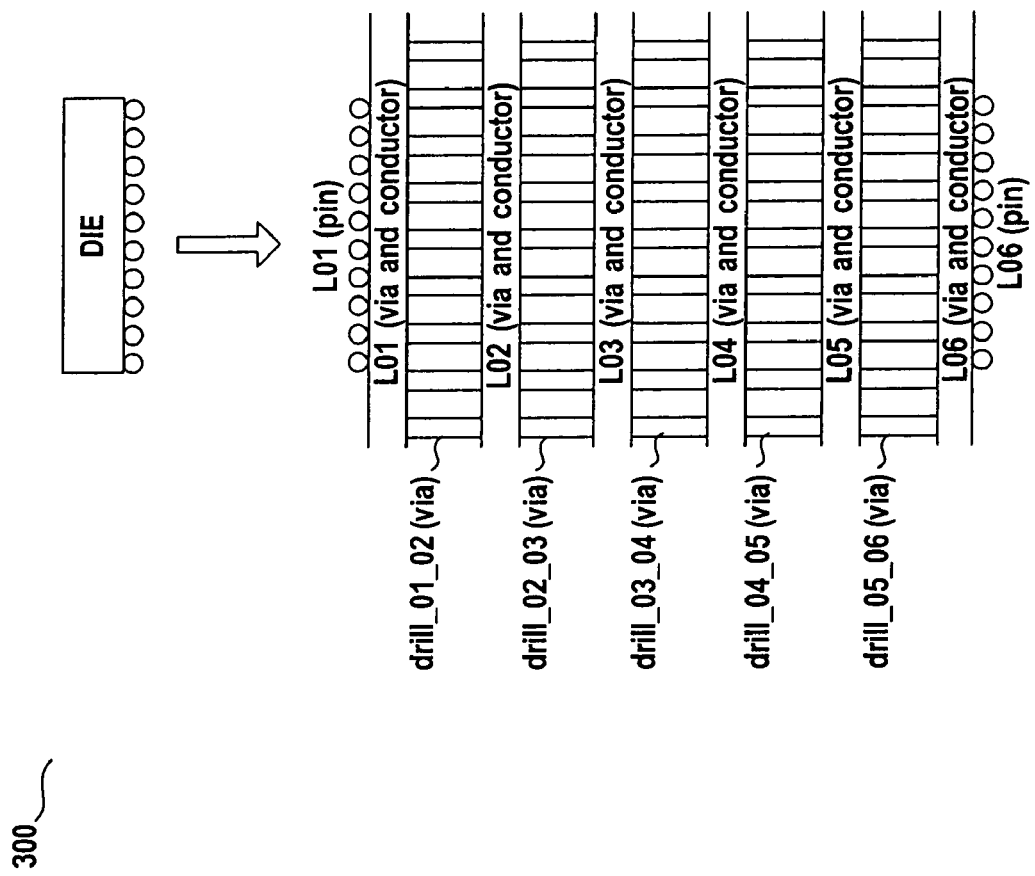
FIG. 3A illustrates a cross-sectional view of a package substrate in accordance with one embodiment of the present invention.

FIG. 3A illustrates a partial cross-sectional view 300 of a six-layer package substrate that includes conductor-and-via layers and via drill layers. Each layer is given a number, a class and a subclass. Layer L01 includes chip landing bumps, conductors and vias. The subsequent layers, except for layer L06, include only conductors and vias. The last layer, or layer L06, includes conductors, vias, and package settling bumps. All layers L01 through L06 are connected together by drill layers drill_01_02 through drill_05_06. While this embodiment illustrates only six layers, it is understood that a package substrate may consist of fewer or more layers. FIG. 3B has a more detailed explanation of the layer's naming convention.

FIG. 3B illustrates a mapping file 306 corresponding to the six-layer package substrate in FIG. 3A. A layer set data in the mapping file 306 includes at least one set of data for conductors, vias, and drill via holes (also known as through-vias). In the first layer set, the conductor data is named layer "1" with a subclass "L01," the via data is named layer "101" with a subclass "L01," while the drill via hole data is named layer "201" with a special subclass "drill_01_02." The drill via hole data subclass naming convention is adapted to easily represent to which two layers the drill via hole layer connects. The layers sets 2 through 5 are similar to the layer set 1. The first and last layers are special layers that contain the chip landing bumps and the package settling bumps. Normally, the chip landing bump layer is named layer "0" with a subclass "L01," which corresponds to the first layer of the cross-sectional view 300 in FIG. 3A. The last layer, which contains the package settling bumps, is typically given the next available centuple number. In this case, the conductor is named layer "6" with a subclass "L06," which corresponds to the last layer in the cross-sectional view 300. Further, package settling bumps are named layer "300" with a subclass "L06."

As discussed with reference to FIG. 1, the mapping file 306 will be added to the package substrate layout dataset, which will be converted and further combined with a chip layout dataset. In order to avoid any double numbering among the layer numbers of the package substrate layers and the chip layers, the layer numbers of the package substrate layers will be adjusted with an offset value. Therefore, this avoids the double numbering problem when the modeling tool checks the combined dataset for errors.

FIG. 4 illustrates a partial textual structure of a command file 400, which corresponds to the step 124 in FIG. 1, in accordance with one embodiment of the present invention. While a modeling tool, such as Calibre, is capable of reading multiple files as input, it must be commanded to do so. Specifically, in order to execute an LVS check of the two GDSII files, the top level cell names and file names of both GDSII files need to be specified. For example, the first three lines of the command file 400 define the chip GDSII file, which is the first file. Line 1 specifies the name, while Line 2 specifies the file path. Line 3 is a command line specifying that the file is a GDSII file. The next three lines of the command file 400 define the package GDSII file, which is the second file. The layer number of the package GDSII file will be shifted by a user-specified offset value. For example, STR1 in Line 4 is the default cell name of GDSII. Furthermore, Line 7 specifies that an offset value 800 will be added to the layer numbers for the package GDSII file. If the package substrate has more than 8 layer sets, the modeling tool will add the next available centuple number in the package GDSII file. The addition of this offset value to the package GDSII file is to ensure that the package substrate layout dataset is treated as a separate entity during the LVS check. It is noteworthy that while a command file based on the GDSII format is used to explain this embodiment, the command file can be of another data structure in compliance with another file format accepted by the modeling tool.

Figure 5A:
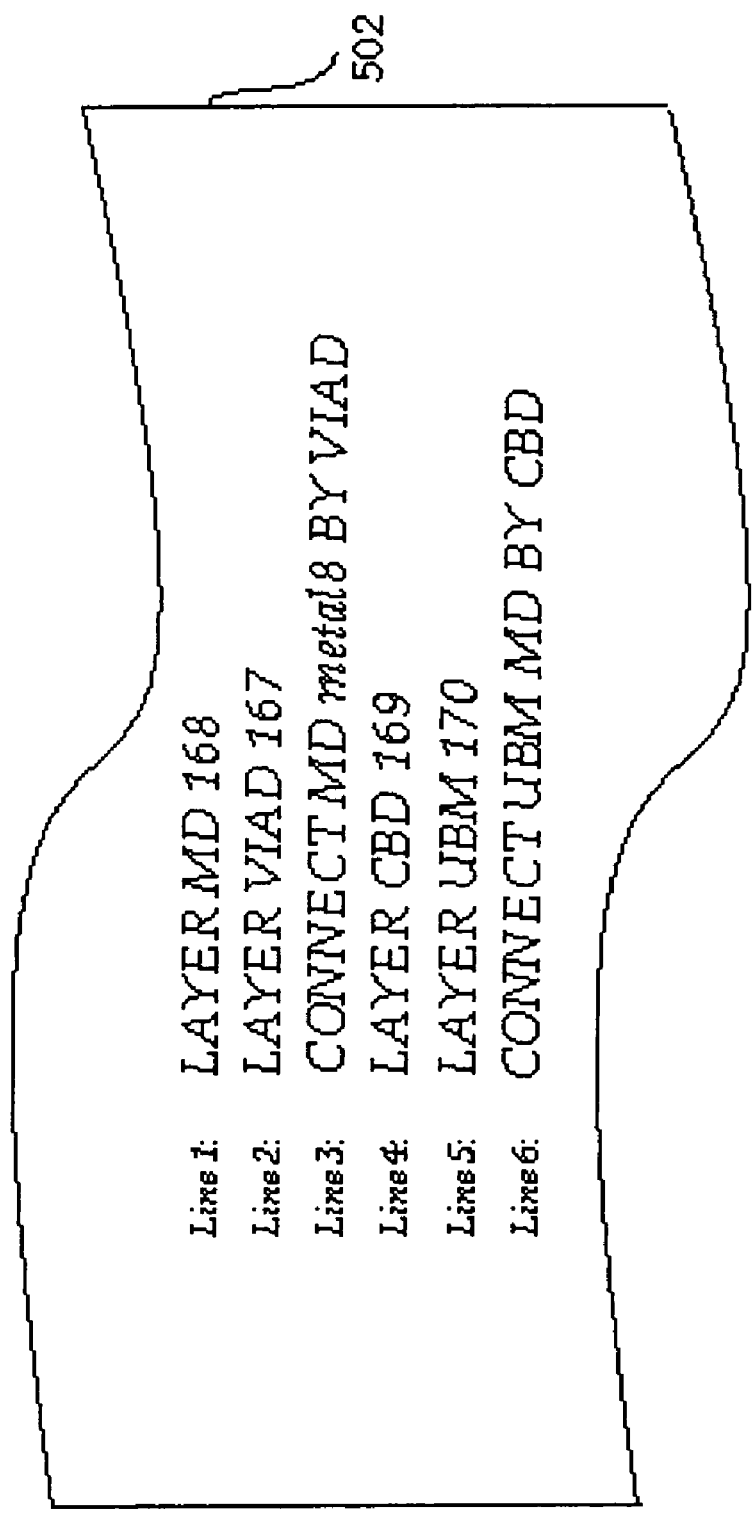
FIGS. 5A-5C illustrate examples of various sections of the command file in accordance with one embodiment of the present invention.
Figure 5B:
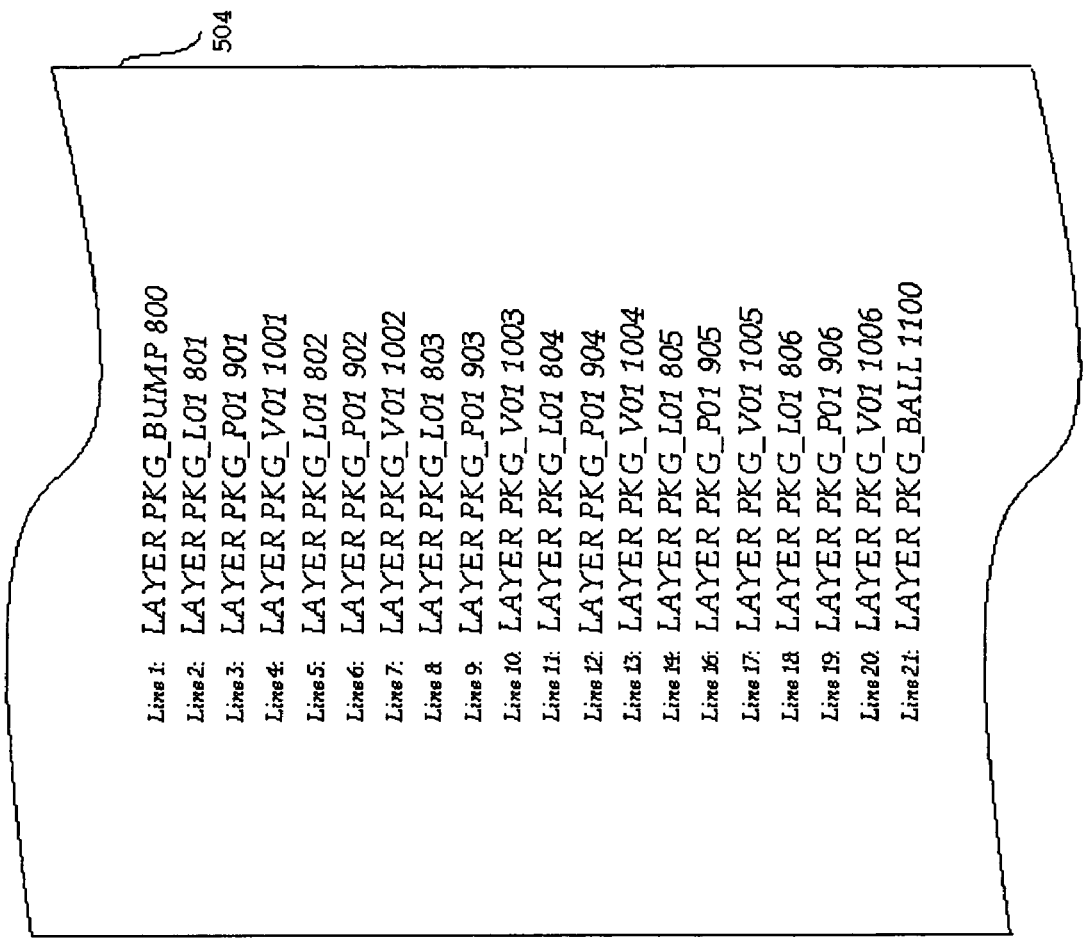
Figure 5C:
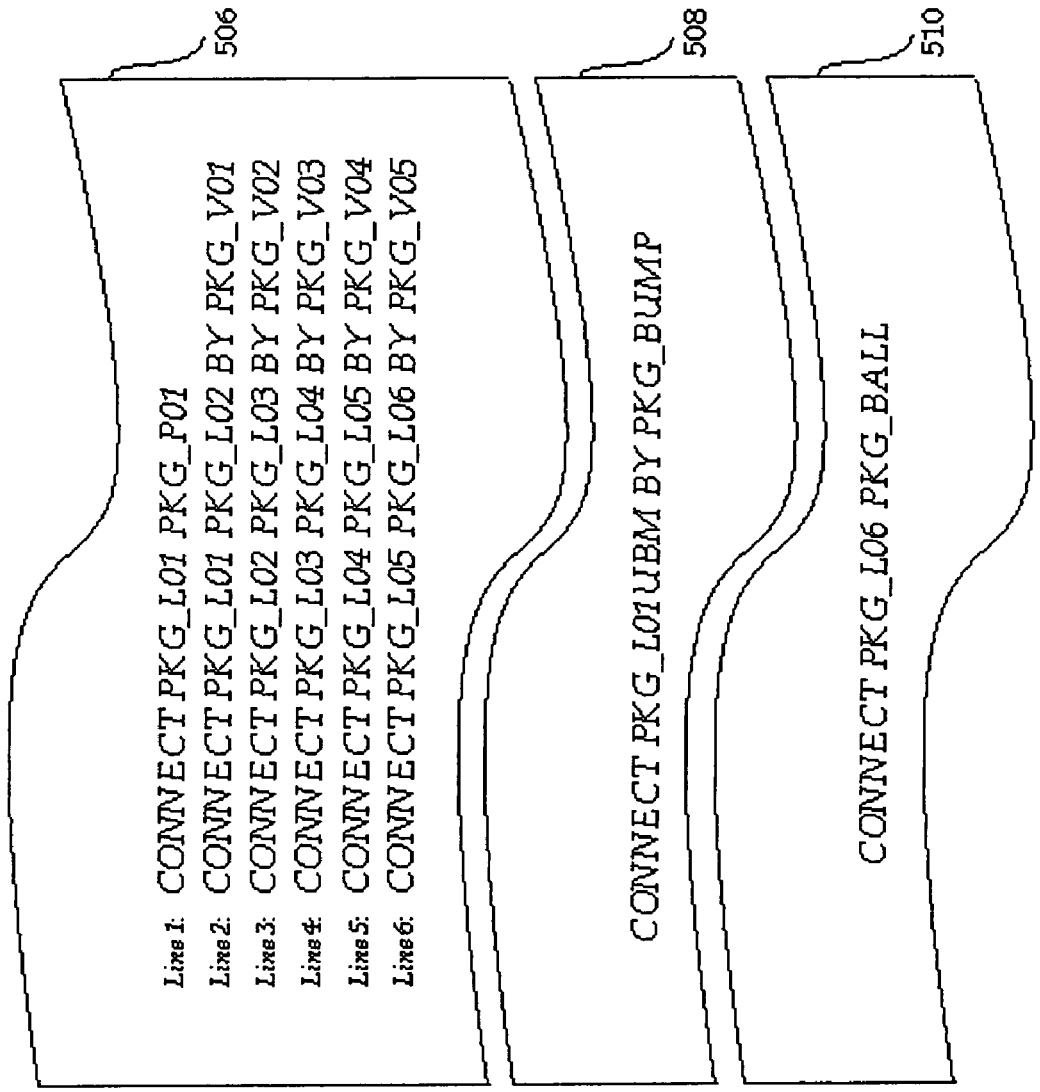

FIGS. 5A-5C illustrate various sections 502, 504, 506, 508, and 510 of a layer definition file as a part of the command file, in accordance with various embodiments of the present invention. Before a checking, such as LVS or DRC, can occur, the package substrate layout dataset need to be modified. The layer definition file may be seen as a modified version of a formatted netlist. The following lists some of the modifications that need to be applied. The section 502 defines one or more layers for bump-to-I/O routing. This step defines the final locations and spacing of the pin-out of the package substrate. This is necessary to ensure that the package's bump layout matches the chip I/O pins. Specifically, Lines 1 through 6 illustrate how the different conductive layers are connected together. Lines 1 and 2 specify the conductor layer and the via layer, while Line 3 specifies the connection between the two layers. Lines 4, 5 and 6 represent a similar structure as what Lines 1, 2, and 3 show.

The section 504 defines layers and mapping. This section is similar to FIG. 3B. Line 1 defines the chip landing bumps. Line 2 defines the conductor layer. Line 3 defines the production layer, while Line 4 defines the via layer. Lines 5 through 19 are similar to Lines 2 through 4. Line 20 defines the package settling bumps. As shown, Line 1 starts with "800," which is the offset value as defined earlier.

The section 506 defines the connections between layers, which are the layers connecting the conductor and via layers together. Line 2 specifies the connection of package layer 1 to package layer 2 using package via 1. Lines 3 through 6 are similar to Line 2, while Line 1 specifies the initial package layer 1, which is slightly different from the other layers because of the bumps defined therein.

The section 508 defines the connections between package's chip landing bumps to the chip's bumps. Similarly, the section 510 defines the connections between the package settling bumps to the bumps of a printed circuit board.

Figure 6:
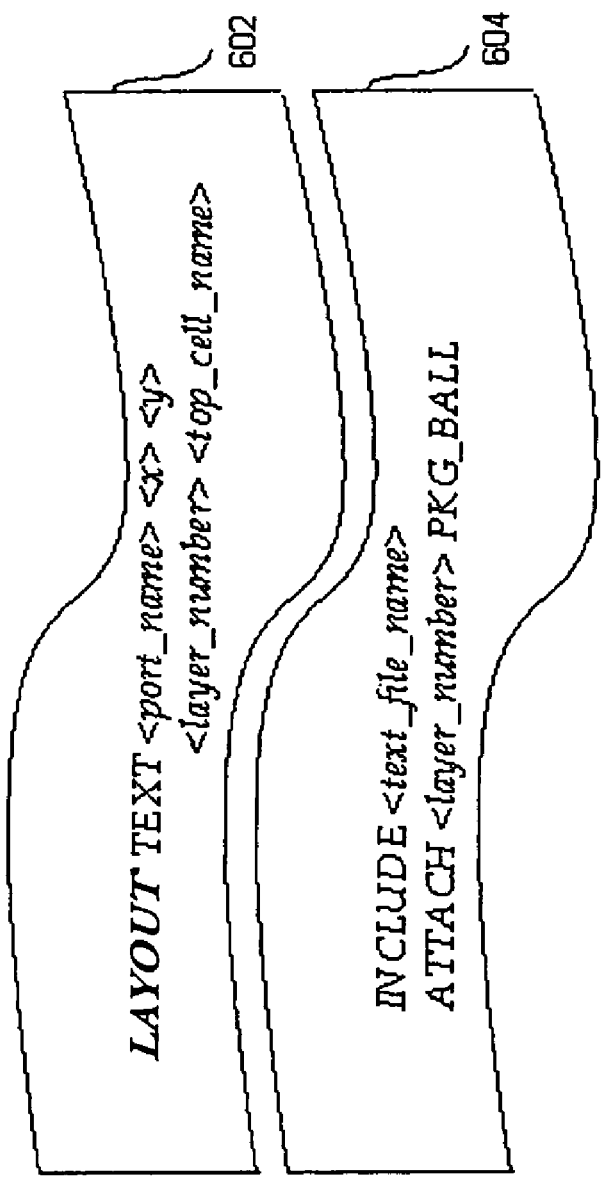
FIG. 6 illustrates a text file for the modeling tool in accordance with one embodiment of the present invention.

FIG. 6 illustrates one example of a text file 602 in accordance with one embodiment of the present invention. This text file 602 corresponds to the step 112 in FIG. 1. As explained earlier, the text file 602 instructs the modeling tool how to handle the combination of the package substrate layout dataset and the chip layout dataset. Specifically, the locations and net names of all package connections such as the solder balls can be input from a software, such as CIOP or APD, to the text file, typically an ASCII file. After flipping and shifting the coordinates, the text file can then be translated by scripts to a format acceptable for the modeling tool to recognize the locations of ports. A section 604 includes additional lines that are added to the command file such that the text file 602 will be parsed.

This invention proposes a novel method and system to integrally check the package substrate layout dataset and chip layout dataset for LVS errors and DRC violations. These checks can be done simultaneously by combining the two datasets as one. Advantages to this invention include faster production of SoC, fewer LVS and DRC errors and cheaper production cost.

Layers of the combined dataset are defined by a user with a software. The definitions include package via and conductive layers, and connections between layers from a chip to a package substrate. After and if all layers have been defined, LVS and DRC errors can be identified. Spreadsheet comparison may still be used for identifying subtle misalignments between bump patterns of the package substrate and the chip. While such misalignment might not cause LVS or DRC violations, it could harm package yield.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for integrally checking a chip layout dataset and a package substrate layout dataset for errors, comprising:
    converting the package substrate layout dataset from a first format into a second format in which the chip layout dataset is provided;
    combining the chip layout dataset of the second format with the package substrate layout dataset of the second format into a combined dataset by using a predetermined modeling tool; and
    checking the combined dataset for errors or design rule violations by providing a command file for instructing the modeling tool to run a layout versus schematic (LVS) check or a design rule check (DRC) on the combined dataset, wherein the command file includes an instruction of adding a predetermined value to each layer number of the package substrate layout dataset for avoiding double numbering among layers of the package substrate layout dataset and the chip layout dataset.

2. The method of claim 1, wherein the first format is a format used for multi-chip module (MCM) package layout.

3. The method of claim 1, wherein the second format is a graphic design system (GDS) II format.

4. The method of claim 1, wherein the converting further comprises:
    providing a mapping file for identifying each layer of the package substrate layout dataset; and
    adding the mapping file to the package substrate layout dataset.

5. The method of claim 4, further comprising adjusting coordinates of the package substrate layout dataset for matching coordinates of the chip layout dataset, before checking the combined dataset.

6. The method of claim 1, wherein the predetermined modeling tool is a Calibre modeling tool.

7. The method of claim 1, wherein the checking comprises providing the modeling tool with a text file having information with respect to connection locations of the package substrate layout dataset.

8. A system for integrally checking a chip layout dataset and a package substrate layout dataset for errors, comprising:
    a first database storing the chip layout dataset in a first format;
    a second database storing the package substrate layout dataset converted from a second format into the first format;
    a modeling tool coupled to the first and second databases for combining the chip layout dataset and the package substrate layout dataset into a combined dataset, and checking the combined dataset for errors or design rule violations; and
    a command file for instructing the modeling tool to add a predetermined value to each layer number of the package substrate layout dataset for avoiding double numbering among layers of the package substrate layout dataset and the chip layout dataset.

9. The system of claim 8, wherein the first format is a graphic design system (GDS) II format.

10. The system of claim 8, wherein the second format is a format used for multi-chip module (MCM) package layout.

11. The system of claim 8, wherein the package substrate layout dataset comprises a mapping file for identifying each layer of the package substrate layout dataset.

12. The system of claim 8, wherein the modeling tool is adapted for running a layout versus schematic (LVS) check or a design rule check (DRC) for the combined dataset.

13. The system of claim 8, further comprising a text file for providing the modeling tool with information regarding solder ball locations of the package substrate layout dataset.

14. A method for integrally checking a chip layout dataset and a package substrate layout dataset for errors, comprising:

providing a mapping file for identifying each layer of the package substrate layout dataset;

combining the mapping file into the package substrate layout dataset;

converting the package substrate layout dataset from a format used for multi-chip module (MCM) package layout into a graphic design system (GDS) II format in which the chip layout dataset is provided;

adjusting coordinates of the package substrate layout dataset for matching coordinates of the chip layout dataset;

combining the chip layout dataset of the GDS II format with the package substrate layout dataset of the GDS II format into a combined dataset by using a predetermined modeling tool; and checking the combined dataset for errors or design rule violations by providing a command file for instructing the modeling tool to run a layout versus schematic (LVS) check or a design rule check (DRC) on the combined dataset, wherein the command file includes an instruction of adding a predetermined value to each layer number of the package substrate layout dataset for avoiding double numbering among layers of the package substrate layout dataset and the chip layout dataset.

* * * * *